(12) United States Patent
Walstrum, Jr. et al.

(10) Patent No.: US 7,301,822 B1
(45) Date of Patent: Nov. 27, 2007

(54) MULTI-BOOT CONFIGURATION OF PROGRAMMABLE DEVICES

(75) Inventors: James A. Walstrum, Jr., San Jose, CA (US); Wayne E. Wennekamp, Rio Rancho, NM (US); Eric E. Edwards, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 143 days.

(21) Appl. No.: 11/131,751

(22) Filed: May 18, 2005

(51) Int. Cl.
*G11C 7/10* (2006.01)
(52) U.S. Cl. ............. 365/189.01; 326/37; 326/38; 326/39; 716/16; 365/233
(58) Field of Classification Search ........... 365/189.01, 365/233; 326/37, 38, 39; 716/16
See application file for complete search history.

(56) References Cited

U.S. PATENT DOCUMENTS

| | | | |
|---|---|---|---|
| 4,940,909 A * | 7/1990 | Mulder et al. | 326/38 |
| 5,343,406 A * | 8/1994 | Freeman et al. | 716/16 |
| 5,426,378 A * | 6/1995 | Ong | 326/39 |
| 5,883,525 A * | 3/1999 | Tavana et al. | 326/39 |
| RE37,195 E | 5/2001 | Kean | |
| 6,337,579 B1 | 1/2002 | Mochida | |
| 6,518,787 B1 | 2/2003 | Allegrucci et al. | |
| 6,774,672 B1 | 8/2004 | Lien et al. | |
| 6,851,047 B1 | 2/2005 | Fox et al. | |
| 7,091,745 B1 | 8/2006 | Jacobson | |
| 7,111,224 B1 * | 9/2006 | Trimberger | 714/764 |

OTHER PUBLICATIONS

James A. Walstrum Jr., "Parallel Interface For Configuring Programmable Devices", U.S. Appl. No. 11/131,764, filed May 18, 2005, 26 pages, available from Xilinx, Inc., 2100 Logic Drive, San Jose, California 95124.
Xilinx, Inc., "Spartan and Spartan-XL Families Filed Programmable Gate Arrays", DS060 (v1.7) Jun. 27, 2002, pp. 1-82, available from Xilinx, Inc., 2100 Logic Drive, San Jose, California .95124.
Xilinx, Inc., "Spartan-3 FGPA Family: Function Description", DS099-2 (v1.3), Aug. 24, 2004, pp. 1-40, available from Xilinx, Inc., 2100 Logic Drive, San Jose, California 95124.

* cited by examiner

*Primary Examiner*—Richard T. Elms
*Assistant Examiner*—Eric Wendler
(74) *Attorney, Agent, or Firm*—Justin Liu; John J. King

(57) ABSTRACT

A programmable device having a multi-boot capability is described. The programmable device may initially load first configuration data for configuring programmable resources of the device. Thereafter, a multi-boot operation may be triggered, causing the device to reconfigure and load second configuration data. Prior to loading the second configuration data, the device may store status information. In some cases, further multi-boot operations may be triggered for loading other configuration data.

19 Claims, 10 Drawing Sheets

MULTI-BOOT CONFIGURATION OF PROGRAMMABLE DEVICES

FIELD OF THE INVENTION

The invention relates to programmable devices, and more particularly, to configuring such devices with different configurations.

BACKGROUND OF THE INVENTION

Programmable devices may include, but are not limited to, programmable logic devices (PLDs), which are a well-known type of digital integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional programmable resources with special purposes (e.g., DLLS, RAM, DSP blocks, multipliers, processors, transceivers).

The CLBs, IOBs, interconnect, and other programmable resources are typically programmed by loading a stream of configuration data (bitstream) into internal configuration memory cells that define how the CLBs, IOBs, interconnect, and other blocks are configured. The configuration data can be read from memory (e.g., an external PROM) or written into the FPGA by an external device. The collective states of the individual memory cells then determine the function of the FPGA.

Another type of PLD is the complex programmable logic device (CPLD). A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In some CPLDs, configuration data is stored on-chip in non-volatile memory, then downloaded to volatile memory as part of an initial configuration sequence.

For all of these programmable logic devices (PLDs), the functionality of the device is controlled by data bits (configuration data or bitstream) provided to the device for that purpose. The data bits can be stored in volatile memory (e.g., static RAM cells, as in FPGAs and some CPLDs), in non-volatile memory (e.g., flash memory, as in some CPLDs), or in any other type of memory cell.

In particular, some programmable devices, including many FPGAs, have internal volatile memory (e.g., SRAM configuration memory) for storing the configuration data or bitstream during operation of the FPGA. Since the internal volatile memory does not retain data when power is not supplied to the device, such programmable devices typically have an external device for providing the bitstream at power up or on reset conditions. The external device may be an external tester/programmer, such as a computer or test fixture, or an external nonvolatile memory, such as a flash or EEPROM memory. Depending on the user's requirements, the external memory may have a serial or a parallel interface. Serial memories may be popular because they have a very compact interface with a small number of pins. However, a memory having a parallel interface may offer significant speed increases that allow a programmable device to be configured in a short amount of time. A parallel interface to a memory may allow for easier random access to the memory. Parallel memories may also be more economical and may be available in larger sizes than their serial counterparts. Furthermore, after configuration has been completed and the programmable device is in normal operation (e.g., the programmable device is performing the specified functions), a user may wish to have read and/or write access to the external memory.

In some applications, it may be useful or desirable for a programmable device, such as an FPGA, to boot up in a first configuration with a first bitstream or set of configuration data. After a certain period of time, a second configuration from a second set of configuration data may be loaded and replace the first configuration.

Therefore, it would be desirable to address these and other needs in programmable devices.

SUMMARY OF THE INVENTION

A system for loading more than one set of configuration data into a programmable device is described. In accordance with embodiments of the present invention, a system having multi-boot capability may include a programmable device having programmable resources and a startup block, and a memory device coupled to the programmable device for storing a plurality of bitstreams for configuring the programmable resources of the programmable device. The programmable device may initially be configured with a first bitstream of the plurality of bitstreams. Triggering multi-boot operation of the programmable device may configure the programmable device with a second bitstream of the plurality of bitstreams.

In accordance with embodiments of the present invention, an integrated circuit may include programmable resources, a startup block coupled to the programmable resources via a multi-boot trigger input of the startup block, and a configuration block for loading a first configuration of the programmable resources. Triggering the multi-boot trigger input of the startup block may selectively enable the configuration block to load a second configuration of the programmable resources.

In accordance with embodiments of the present invention, a method for configuring a programmable device may include the steps of loading first configuration data on the programmable device, beginning normal operation of the programmable device in a first configuration corresponding to the first configuration data, triggering a multi-boot operation, writing current status of the programmable device to a status register, loading second configuration data on the programmable device, and beginning normal operation of the programmable device in a second configuration corresponding to the second configuration data.

Additional novel aspects and embodiments are described in the detailed description below. The appended claims, and not this summary, define the scope of the invention.

BRIEF DESCRIPTION OF THE DRAWINGS

The present invention is illustrated by way of example, and not by way of limitation, in the following figures, in which like reference numerals refer to similar elements.

FIG. 11 shows a flow diagram for operation of a programmable device configured for multi-boot in accordance with an embodiment of the present invention.

DETAILED DESCRIPTION

The present invention is believed to be applicable to a variety of systems having programmable or configurable devices, such as programmable logic devices or integrated circuits having some programmable resources. The present invention has been found to be particularly applicable and beneficial for systems including a programmable logic device and an external memory for storing configuration data. While the present invention is not so limited, an appreciation of the present invention is presented by way of specific examples, such as a field programmable gate array (FPGA) having an external nonvolatile memory for storing configuration data.

In the following description, numerous specific details are set forth to provide a more thorough understanding of the present invention. However, it will be apparent to one ordinarily skilled in the art that the present invention can be practiced without these specific details. In other instances, well-known circuits and devices may be omitted or presented in abstract form in order to avoid obscuring the present invention.

Figure 1:
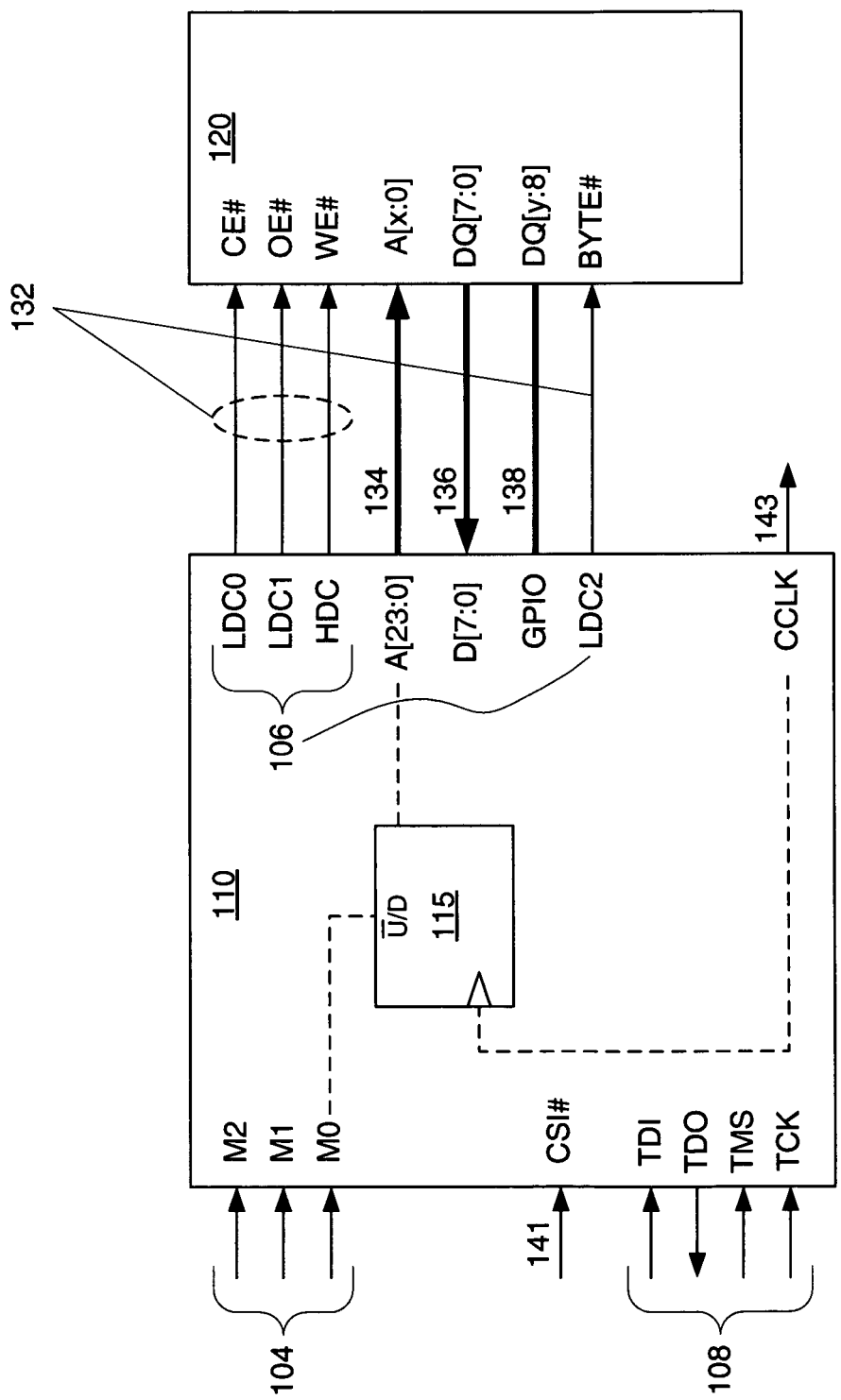
FIG. 1 shows a system for configuring a programmable device in accordance with an embodiment of the present invention.

FIG. 1 shows a system 100 for configuring a programmable device 110 in accordance with an embodiment of the present invention. System 100 also includes an external storage or memory device 120 for storing configuration data for configuring programmable device 110. In some embodiments, programmable device 110 may be a programmable logic device (PLD) such as a field programmable gate array (FPGA). Examples of FPGAs are the Virtex-II, Virtex-4, and Spartan 3 families of FPGAs available from Xilinx, Inc. In some embodiments, external storage device 120 may be a nonvolatile memory, for example flash memory or an EEPROM. Such memories may be available from any of a number of suppliers including Advanced Micro Devices Inc., Atmel Corp., Micron Technology Inc., and Intel Corp.

Programmable device 110 may include one or more mode pins 104 such as pins M2-M0 in FIG. 1. The mode pins may be used determine the configuration or programming mode for programmable device 110. Programming modes may include master serial, slave serial, master SelectMAP, slave SelectMAP, and JTAG. Some methods for configuring an FPGA may be described in greater detail in the "Spartan-3 FPGA Family: Functional Description," DS099-2 (v1.3), pages 32-39, dated Aug. 24, 2004, available from Xilinx, Inc. Programmable device 110 may be configured according to the configuration mode specified by the state of mode pins 104. Programmable device 110 may also include a standard JTAG interface 108, which includes inputs TDI, TMS, and TCK, and an output TDO. The JTAG interface may be used for configuration, testing, and other operations of the device.

In accordance with embodiments of the present invention, programmable device 110 may include a configuration mode for communicating with an external parallel peripheral such as a parallel memory device. As shown in FIG. 1, an interface between programmable device 110 and external parallel device 120 may include configuration control lines 132, address lines 134, and data lines 136. In some embodiments, additional lines 138 may be coupled between programmable device 110 and external device 120.

In general, external storage device 120 may have one or more control inputs. For instance, as shown in FIG. 1, an external device may have active-low chip enable (CE#), output enable (OE#), write enable (WE#), and byte mode (BYTE#) inputs. As is known in the art, various storage devices may have more or fewer control signals that may control these and other aspects of the external device. The chip enable input CE# may selectively enable the memory device for operation, the output enable input OE# may selectively enable the memory device to drive an output on its data lines, the write enable input WE# may selectively enable other devices to write to the memory device, and the byte mode input BYTE# may selectively place the memory device in a byte-wide mode. Address lines 134 from programmable device 110 may provide memory addresses to the memory device, and data lines or data bus 136 may provide a data bus for transferring data to and from the memory device. In the example shown in FIG. 1, 24-bit addresses A[23:0] are provided by programmable device 110 to memory device 120, although in general, the interface may have an arbitrary number of address lines. Also, memory device 120 may, in general, have a (y+1)-bit wide data bus DQ[y:0], where y may be any desirable width. For example, some memory devices may have byte-wide (e.g., 8-bit) or word-wide (e.g., 16-bit or 32-bit) data buses, or other bus widths may be used. As shown in FIG. 1, data bus 136 between programmable device 110 and external device 120 is a byte-wide (e.g., 8-bit wide) data bus, and thus only 8 bits DQ[7:0] of the external device are used in the interface. Additional data bits DQ[y:8] may be connected to general-purpose I/O (GPIO) pins of programmable device 110 or connected to other devices for other purposes, or may be left unconnected or coupled to fixed values. Note that while data bus 136 shown in FIG. 1 is a byte-wide bus, other widths may be used in various embodiments.

The configuration control lines 132 may be connected to configuration control pins 106 of programmable device 110. For example, as shown in FIG. 1, programmable device 110 may include configuration control pins LDC0, LDC1, LDC2, and HDC for controlling the CE#, OE#, BYTE#, and WE# inputs, respectively, of external device 120. Each LDC (e.g., low during configuration) pin may provide a logic low output while the programmable device is being configured, and each HDC (e.g., high during configuration) pin may provide a logic high output during configuration. Once programmable device 110 is configured and ready for regular operation, some or all of configuration control pins 106 may be available to the user as general-purpose I/O (GPIO), and programmed or configured for use in any user applications. Note that while three LDC pins and one HDC pin are shown in FIG. 1, other programmable devices may have any number of configuration control pins, for example in any combination of LDC or HDC pins, as may be necessary or desirable to implement other interfaces with other external devices. Furthermore, in some embodiments, configuration control pins 106 may be configurable, for example by mode pins 104, to provide either a logic high or a logic low output during configuration depending on the requirements of the desired interface. Thus, configuration control pins 106 of programmable device 110 allow the programmable device to interface with external devices, such as parallel nonvolatile memories. Since configuration control pins 106 are not dedicated and may be used as GPIO after configuration, they may be reclaimed for other applications by the user.

Programmable device 110 may also generate and provide memory addresses to external device 120. For example, programmable device 110 may provide a series of consecutive addresses to an external memory device to retrieve a block of configuration data. The memory device may then provide the data stored at each address to the programmable device via data bus 136. The memory device may continue to provide data until the entire bitstream has been output and programmable device 110 is configured. In some embodiments, programmable device 110 may include a counter 115 for providing the memory addresses. A configuration clock CCLK, which may be an internal clock or may be provided by an external source, may drive counter 115 and control timing of the memory accesses. The same clock may also be used to latch data on data bus 136. Configuration clock CCLK may also be provided as an external output 143 for use in some applications. In some embodiments, programmable device 110 may be configured to start at an address of all zeros and count up, or to start at an address of all ones and count down. For instance, one mode pin 104, e.g., M0, may be used to choose either a count up mode or a count down mode. The same mode pin may also be used to choose an all zeros or an all ones starting address. In some embodiments, the counter may be a loadable counter and thus may be configurable to begin counting either up or down at an arbitrary memory address. For example, a "jump" or starting address may be provided in a table in external device 120, by a header at a certain location, or by other means. During configuration, the jump address may be provided to programmable device 110 and loaded into counter 115. In this manner, the configuration data stored in external device 120 may be stored at any arbitrary memory location.

Figure 2:
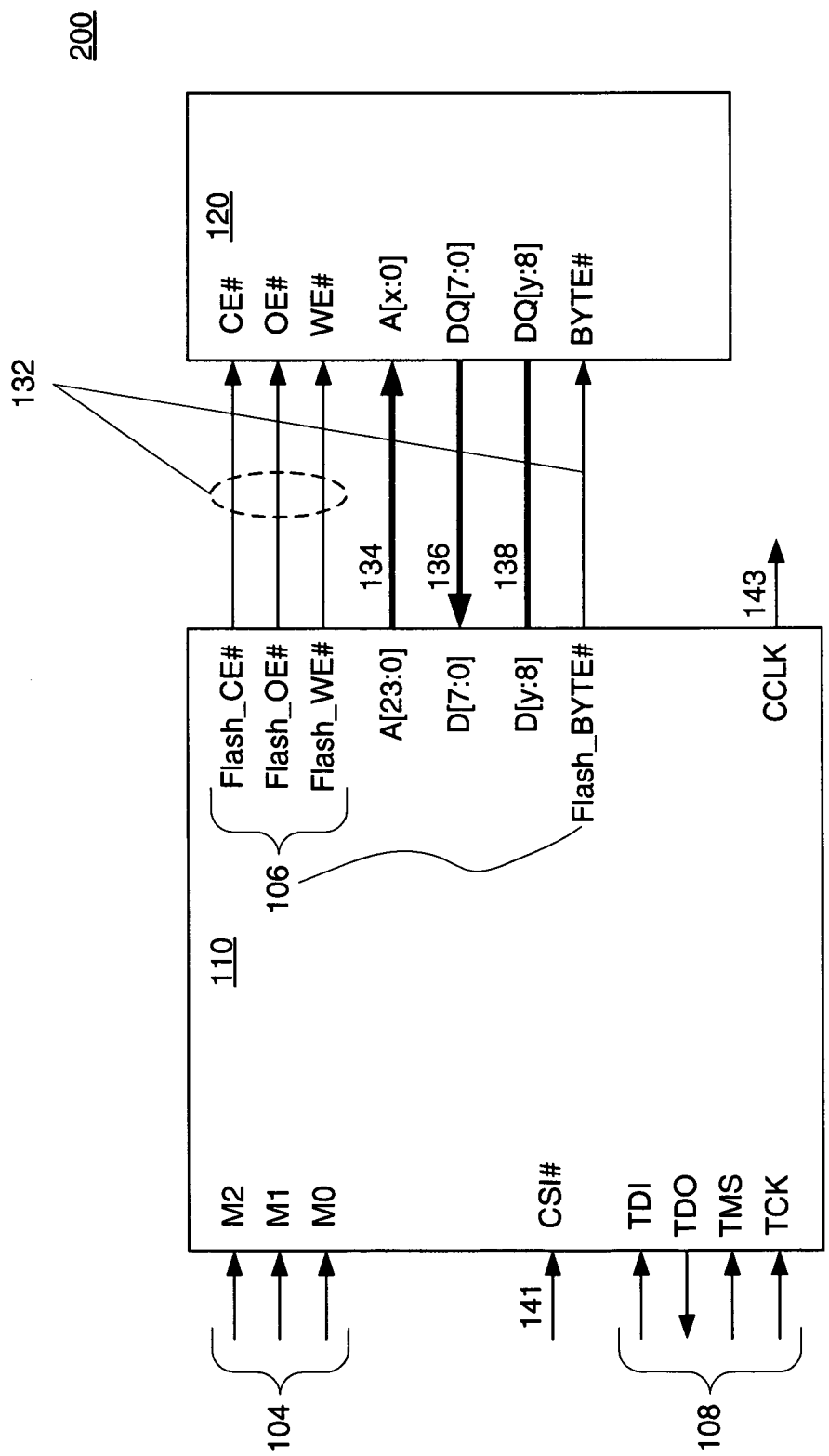
FIG. 2 shows a system for operating a programmable device after configuration in accordance with an embodiment of the present invention.

FIG. 2 shows a system 200 for operating programmable device 110 after configuration in accordance with an embodiment of the present invention. Thus, system 200 may corresponds to system 100 of FIG. 1 after programmable device 110 has received the configuration data from external device 120, and programmable device 110 is now configured and ready for regular or normal operation. As noted above, after configuration is complete, configuration control pins 106 may be available for general purposes. In the example shown in FIG. 2, LDC0, LDC1, LDC2, and HDC are now the user-controlled pins Flash_CE#, Flash_OE#, Flash_BYTE#, and Flash_WE#, respectively. These pins may be controlled internally, for example by a configured circuit within programmable device 110, to operate external device 120. That is, the user has full control over these pins and may use them for any desirable application.

For example, after configuration is complete, the user may want to have continued access to external memory device 120. The external memory device may be available to the user as a general purpose memory. Thus, user data may be stored to and retrieved from external memory device 120. For instance, a user may pre-store data in the memory device (e.g., prior to power up or initial configuration) to be retrieved during operation of programmable device 110. A user may also write data to the memory device and use the external memory device to supplement internal memory resources. In embodiments where external memory device 120 is a nonvolatile memory, a user may store data in the memory device that may be retrieved after a reset or power-up condition. In some embodiments, a user may read from or write to portions of memory device 120 that store the configuration data. Thus, as will be described below in greater detail, a user may alter the bitstream such that when programmable device 110 is reset or power-cycled, an alternate configuration may be loaded and programmable device 110 may be used for an alternate application, allowing for reconfiguration of programmable device 110. In some instances, the alternate application may be a revised or updated version of the present application. In embodiments where an 8-bit data bus 136 is used during configuration, a bus having a different width may be available during operation of programmable device 110. For instance, external device may be capable of 16-bit access, and additional data bus lines 138 may be used to extend the data bus for user accesses.

Figure 3:
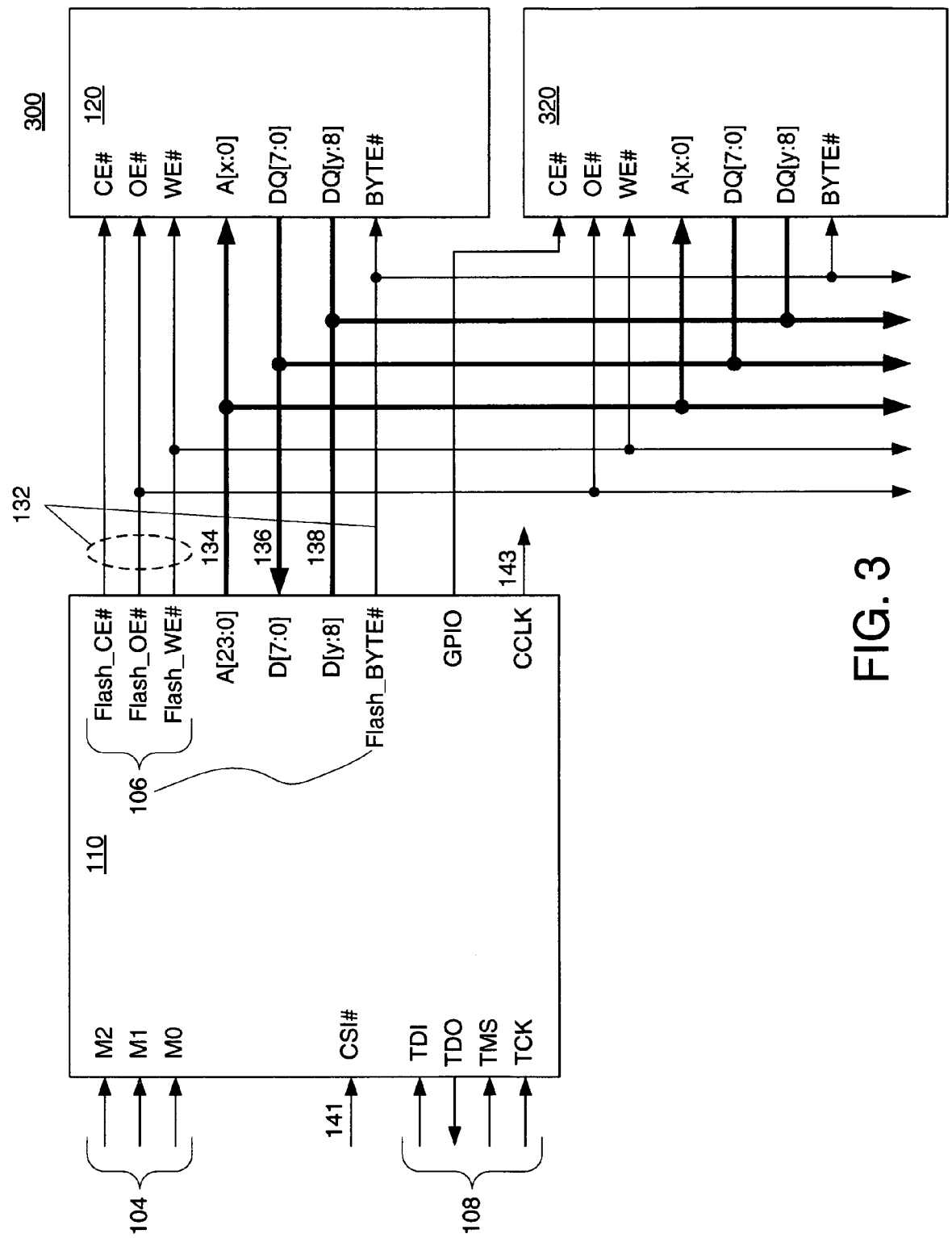
FIG. 3 shows a system for operating a programmable device with more than one external device in accordance with an embodiment of the present invention.

FIG. 3 shows a system 300 for operating a programmable device 110 with more than one external device in accordance with an embodiment of the present invention. As shown in the figure, a first external device 120 and a second external device 320 may be connected to programmable device 110. Note that while two external devices are shown, an arbitrary number of external devices may be connected to programmable device 110. The external devices may share one or more of control lines 132, address lines 134, and data bus lines 136 and 138. In some embodiments, the chip enable (CE#) input of each external device may independently controlled by separate pins of programmable device 110. This allows for each chip to be selected independently for accesses via the control, address, and data lines. In other embodiments, other well-known bus control and arbitration schemes, such as using unique identifiers or collision detection, may be used to select one or more of the external devices for access.

In some embodiments, external device 320 may be an additional external memory. For instance, if external memory 120 is not large enough to store all the data needed for user applications, one or more additional memories 320, such as flash or SRAM memories, may be added to the system. In some embodiments, one or more of the additional external devices 320 may be a microcontroller or a processor, such as a microprocessor, a digital signal processor, or a network processor. Other peripherals and integrated circuits, such as additional programmable devices or ASSPs (application specific standard product), may also be coupled to interface.

Figure 4:
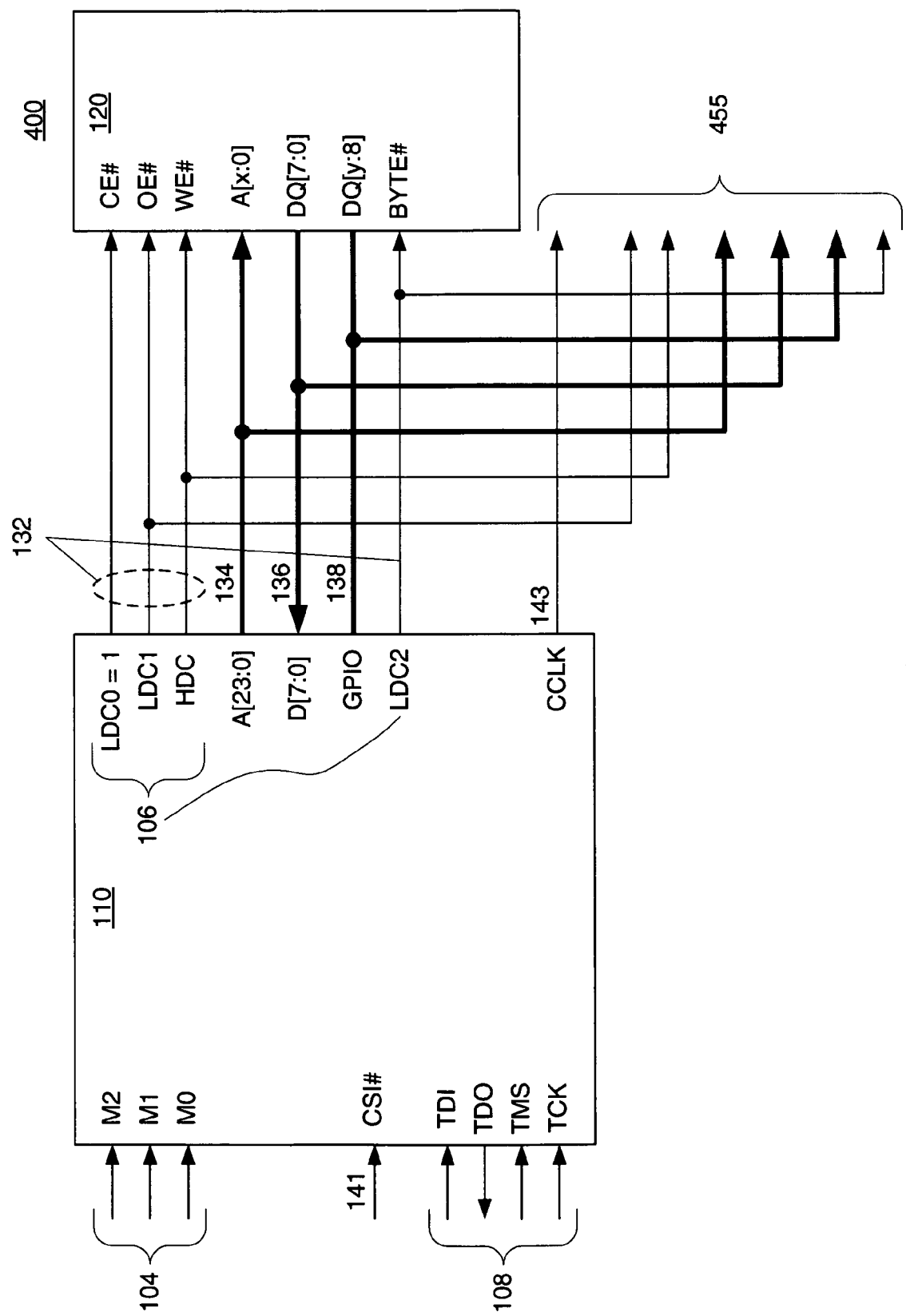
FIG. 4 shows a system for reusing a configuration interface of a programmable device after configuration in accordance with an embodiment of the present invention.

FIG. 4 shows a system 400 for reusing a configuration interface of a programmable device 110 after configuration in accordance with an embodiment of the present invention. In some applications, external memory device 120 may not be needed after configuration is complete. That is, external memory device 120 may be used only for storing the configuration data. In such cases, a user may want to reuse the interface pins for alternate purposes. Since the pins of the interface are fully configurable and available as GPIO after configuration of programmable device 110 has completed, pins 455 may be "reclaimed" and made available for other functions once programmable device 110 is in its normal operating mode. For example, pins 455 may be used to connect to other devices or circuits. In some cases, external device 120 may be disabled or deactivated after configuration. Disabling external device 120 may reduce the power consumption of the system, and may also prevent external device 120 from interfering with the signals on reclaimed pins 455. In some embodiments, external device 120 may be disabled by de-asserting chip enable input CE#. Thus, in the example shown FIG. 4, only one pin, LDC0, needs to remain connected to external device 120. If the chip enable input is active low, LDC0 may be configured to provide a constant logic '1' while programmable device 110 is in its normal operating mode. All of the other pins of the interface between programmable device 110 and external device 120 that were used to transfer the bitstream may be made available as GPIO. This arrangement allows for support of wide address and data buses between the devices for fast and efficient configuration without requiring a large number of dedicated interface pins.

Figure 5:
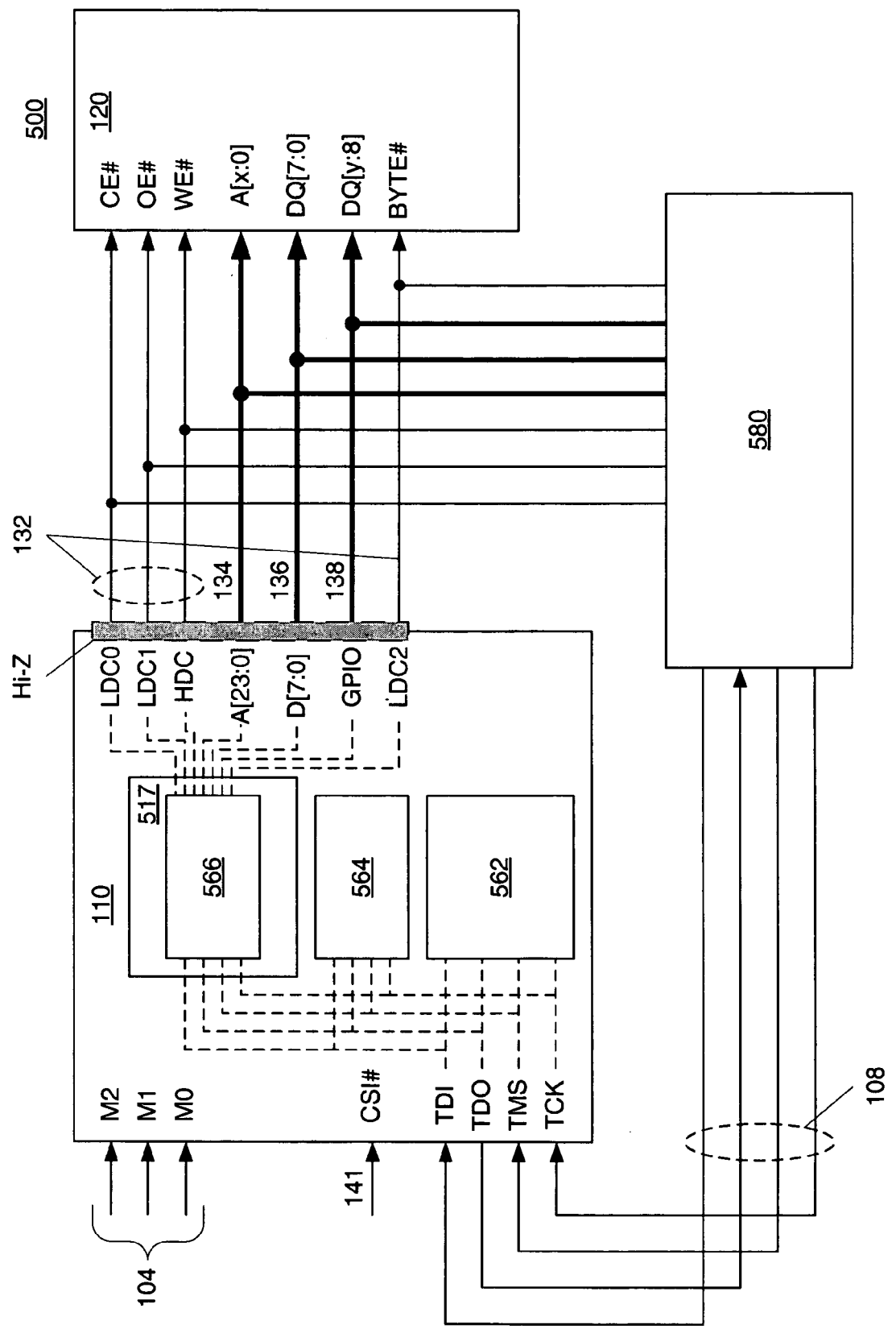
FIG. 5 shows a system for configuring a programmable device or an external memory in accordance with an embodiment of the present invention.

FIG. 5 shows a system 500 for configuring a programmable device 110 or an external memory 120 in accordance with an embodiment of the present invention. System 500 includes a programming or testing module 580 for configuring at least one of programmable device 110 and external device 120. For example, programming module 580 may be a computer or a test fixture. Programming module 580 may operate in one or more modes. In a first mode, programming module 580 may directly configure programmable device 110 through JTAG interface 108. That is, mode pins 104 may be set to place programmable device 110 in a JTAG programming mode, or accessing the JTAG interface may automatically override other programming modes. Programming module 580 may then provide a sequence of TDI, TMS and TCK signals to a configuration module 562 within programmable device 110 for downloading a bitstream to the device and configuring programmable device 110. Programming module 580 may, for example, provide an alternate configuration that is different from the configuration stored in external device 120. This may be useful, for example, while testing or debugging a particular design or application of programmable device 110 before the design is finalized.

Programming module 580 may also be directly coupled to control lines 132, address lines 134, and data bus 136/138 to configure programmable device 110 through a parallel interface. That is, programming module 580 may mimic signals that would be provided by an external memory device 120. This allows programming module 580 to configure programmable device 110 through a parallel interface for faster configuration. In other embodiments, JTAG interface 108 may be used to issue a reset instruction for causing programmable device 110 to reset and re-download configuration data from external device 120.

Programming module 580 may also be used for accessing external device 120. For example, a user may design and compile a design, and generate a bitstream for that design. The user may then write the generated bitstream to external memory device 120 for configuring programmable device 110 using programming module 580. The user may also use programming module 580 to verify or retrieve data from external device 120. In some embodiments, programming module 580 may be coupled to control lines 132, address lines 134, and data lines 136/138 for direct access to the external memory. Programming module 580 may directly drive these lines to access and control external memory device 120. In such instances, it may be desirable to place the pins of programmable device 110 in a high impedance (e.g., Hi-Z) state, via, for example, tri-state buffers, so as not to damage these pins. By connecting directly to the inputs of memory device 120, programming module 580 may read and write directly from and to the memory device.

In some programming modes, programming module 580 may indirectly access external device 120 through JTAG interface 108 of programmable device 110. In some embodiments, programming module 580 is coupled through JTAG interface 108 to a JTAG TAP controller 564 of programmable device 110. As is well-known, JTAG EXTEST and SAMPLE/PRELOAD instructions may be used to scan data to and from a boundary scan register of programmable device 110, allowing for control of the external I/O pins of the device. Thus, a user may write data to and read data from external device 120 by appropriate use of standard JTAG instructions to control the external I/O pins, including interface lines 132, 134, and 136/138, of programmable device 110. By connecting a programming module 580 to JTAG interface 108 of programmable device 110, a user may access both programmable device 110 and external device 120 through a standard and compact interface. This may be particularly useful for testing, debugging, or refining a design.

In other embodiments, a circuit 566 may be used for programming external device 120 with data received via JTAG interface 108. For example, a portion of circuit 566 may be configured as a JTAG UART (universal asynchronous receiver-transmitter) to receive data from JTAG interface 108. The received data may be sent to a portion of circuit 566 configured as a controller coupled to interface lines 132, 134, and 136/138, and used to program external device 120. That is, circuit 566 transfers data received via JTAG interface 108 to external device 120. This arrangement may offer a performance enhancement over the previously described access using the JTAG TAP controller and standard JTAG EXTEST and SAMPLE/PRELOAD instructions, since only data needed to control external device 120, and not the entire boundary scan register, is required. In some embodiments, some or all of circuit 566 may be dedicated circuitry. In other embodiments, some or all of circuit 566 may be implemented in programmable resources 517 of programmable device 110. That is, programmable device 110 may be first configured with configuration data for implementing the controller and UART of circuit 566, such as via a JTAG programming mode as previously described. In some embodiments, programmable device 120 may be an FPGA and programmable resources 517 may be programmable fabric of the FPGA. In embodiments where circuit 566 is implemented in programmable resources of programmable device 110, once external device 120 has been programmed and circuit 566 is no longer needed, the configurable resources may be reconfigured for other applications. For example, a reset line or a JTAG instruction may cause the programmable device to reconfigure using the newly written configuration data.

Figure 6:
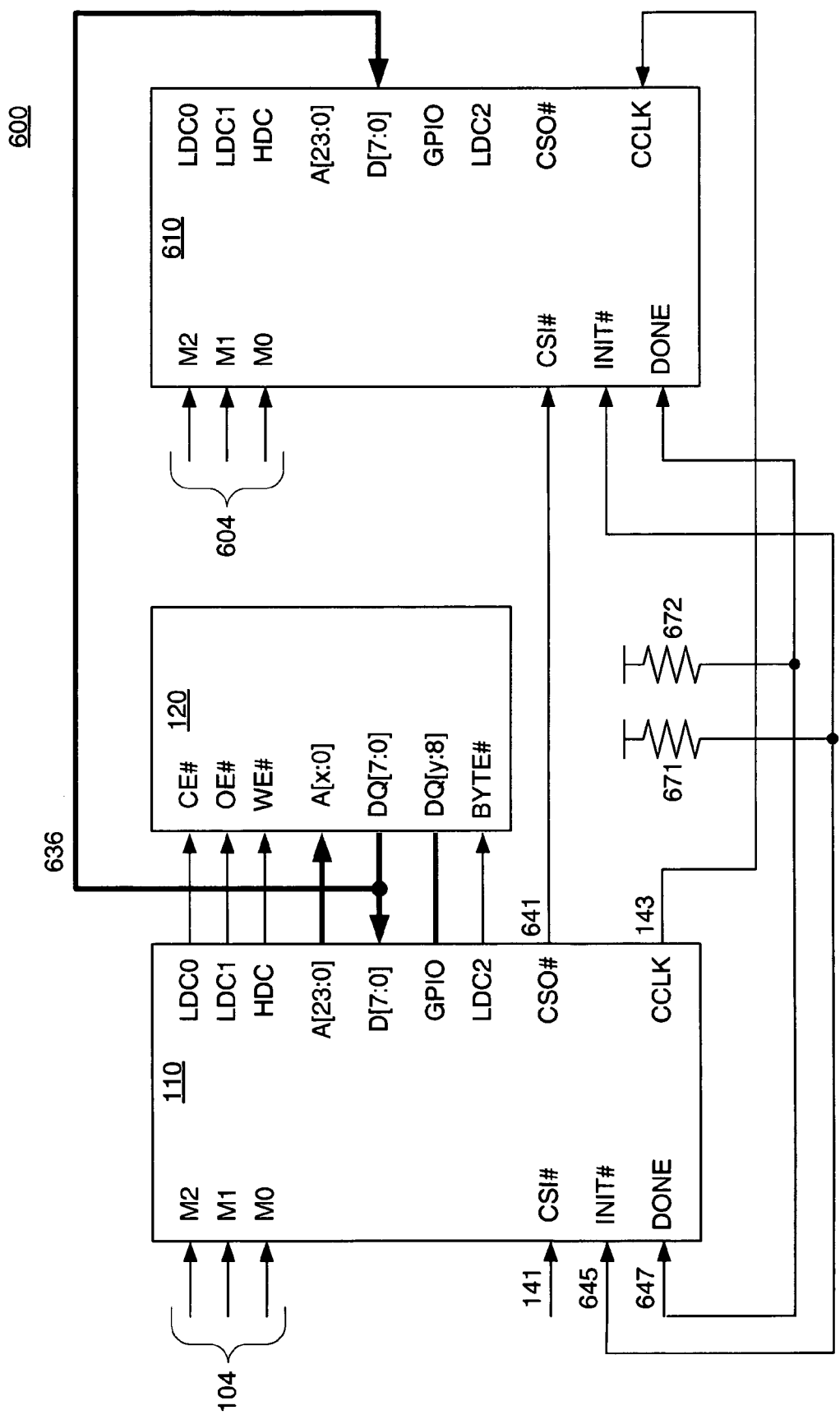
FIG. 6 shows a system for configuring more than one programmable device in accordance with an embodiment of the present invention.

FIG. 6 shows a system 600 for configuring more than one programmable device in accordance with an embodiment of the present invention. As shown in FIG. 6, external device 120 is coupled to a first programmable device 110 and a second programmable device 610. Note that while only two programmable devices are shown, any number of programmable devices may be configured as described herein. In some embodiments, each of the programmable devices 110 and 610 may be identical, and in other embodiments the programmable devices may be different, for example they may have different sizes. In the example shown in FIG. 6, programmable device 110 may be designated a "master" device, for example via mode pins 104, that controls external device 120 and the configuration process. Any number of "slave" devices, such as device 610, may be designated as such via mode pins 604 and chained from programmable device 110. Each slave device 610 may share the data bus lines 636 for receiving data from external device 120. Master device 110 may source configuration clock CCLK 143 to slave devices 610 to provide timing information to the slave devices. For instance, CCLK may be used to latch data provided on data bus 636.

Initialization pins INIT# of programmable devices 110 and 610 may be coupled together by line 645, and done pins DONE of programmable devices 110 and 610 may be coupled together by line 647. The INIT# pin of each device may be internally asserted while the device powers up, and may be further asserted externally to delay start of the configuration process. When INIT# is de-asserted, configuration may begin, and asserting INIT# during configuration may indicate a configuration error. The DONE pin of each device may indicate that the device has completed its configuration process. In some embodiments, INIT# may be an active low signal and DONE may be an active high signal, and both INIT# and DONE may be open drain pins having weak pullups 671 and 672 coupled to lines 645 and 647, respectively.

Finally, the programmable devices may be chained together via the chip select input CSI# pins and the chip select output pins CSO#, which may be active low signals. That is, the CSO# output of programmable device 110 may be coupled to the CSI# input of programmable device 610, and further slave devices may be chained to the CSO# output of device 610 in a similar manner. The chip select inputs CSI# may be used to enable (or select) each device in turn for configuration, such that only one programmable device is enabled at a time for configuration and the enabled device reads configuration data from data bus 636. Once a programmable device has completed configuration, it asserts its CSO# output so that the next device in the chain may be configured. In other embodiments, other schemes for passing control may be applied. For instance, each device in the chain may scan data bus 636 for a unique identifier to identify the configuration data intended for that device.

Thus, in an example configuration sequence, system 600 may be powered up or reset. Once all of the programmable devices have properly powered up, initialization line 645 may be de-asserted to allow configuration to begin. A master device (e.g., programmable device 110) may be configured to provide a sequence of addresses and control signals to external memory device 120 that cause the external device to provide data stored at those addresses. As described above, in some embodiments the addresses may be provided by a counter that counts up or counts down at each CCLK edge from a predetermined starting address, such as an all zeros or all ones address. The first set of data provided by the external device may correspond to a bitstream for configuring the master device. Once the master device has completed configuration, it may assert its CSO# output to enable the first slave device in the chain. The master device may continue to provide a sequence of addresses to the external memory device, and the next set of data provided by the memory device on data bus 636 may correspond to a bitstream for configuring the first slave device. If there are further slave devices in system 600, after the first slave device completes configuration, its CSO# output may be used to enable the next device in the chain. Each device in the chain may then be configured in turn until all devices have completed their respective configuration processes. Advantageously, this arrangement allows for a single external memory device to store configuration data for multiple programmable devices.

Figure 7:
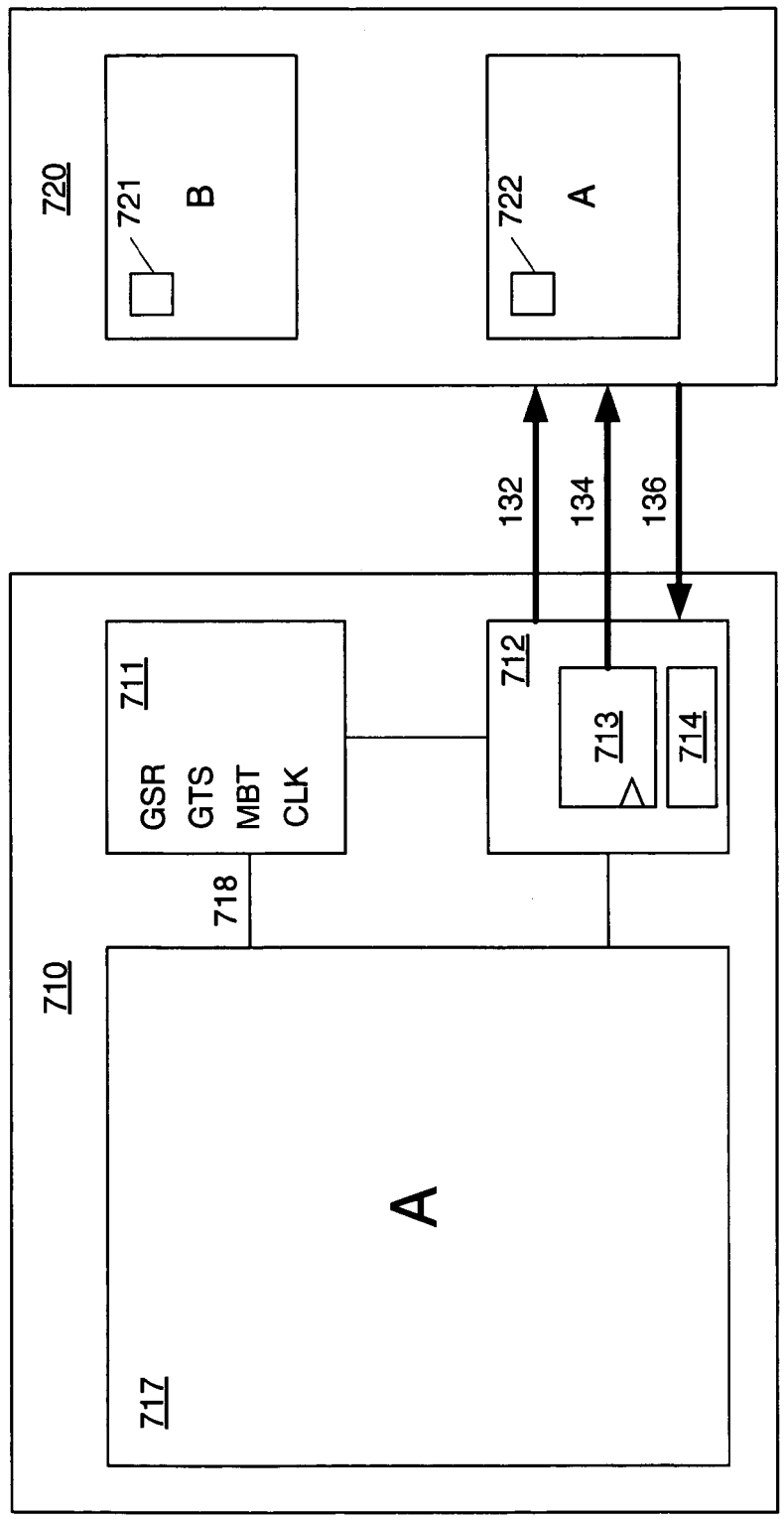
FIG. 7 shows a system with a programmable device having multi-boot configuration capabilities in a first configuration in accordance with an embodiment of the present invention.

FIG. 7 shows a system 700 with a programmable device 710 having multi-boot configuration capabilities in a first configuration in accordance with an embodiment of the present invention. In some embodiments, programmable device 710 may be a programmable logic device, such as a field programmable gate array, or may be an integrated circuit having some programmable resources. In some cases, programmable device 710 may be similar or identical to previously described programmable device 110. Programmable device 710 may be coupled to a memory device 720 for storing configuration data for configuring programmable device 710. In some embodiments, memory device 720 may be an external nonvolatile memory. In other embodiments, memory device may be integrated with programmable device 710 as a single integrated circuit. Programmable device 710 includes programmable resources 717, a startup block 711, and configuration block 712. Memory device 720 may include at least two separate bitstreams, A and B, corresponding two different configurations of programmable device 710. As shown in FIG. 7, programmable resources 717 of programmable device 710 may be initially configured with configuration data A stored in memory device 720, corresponding to a first design.

Figure 8:
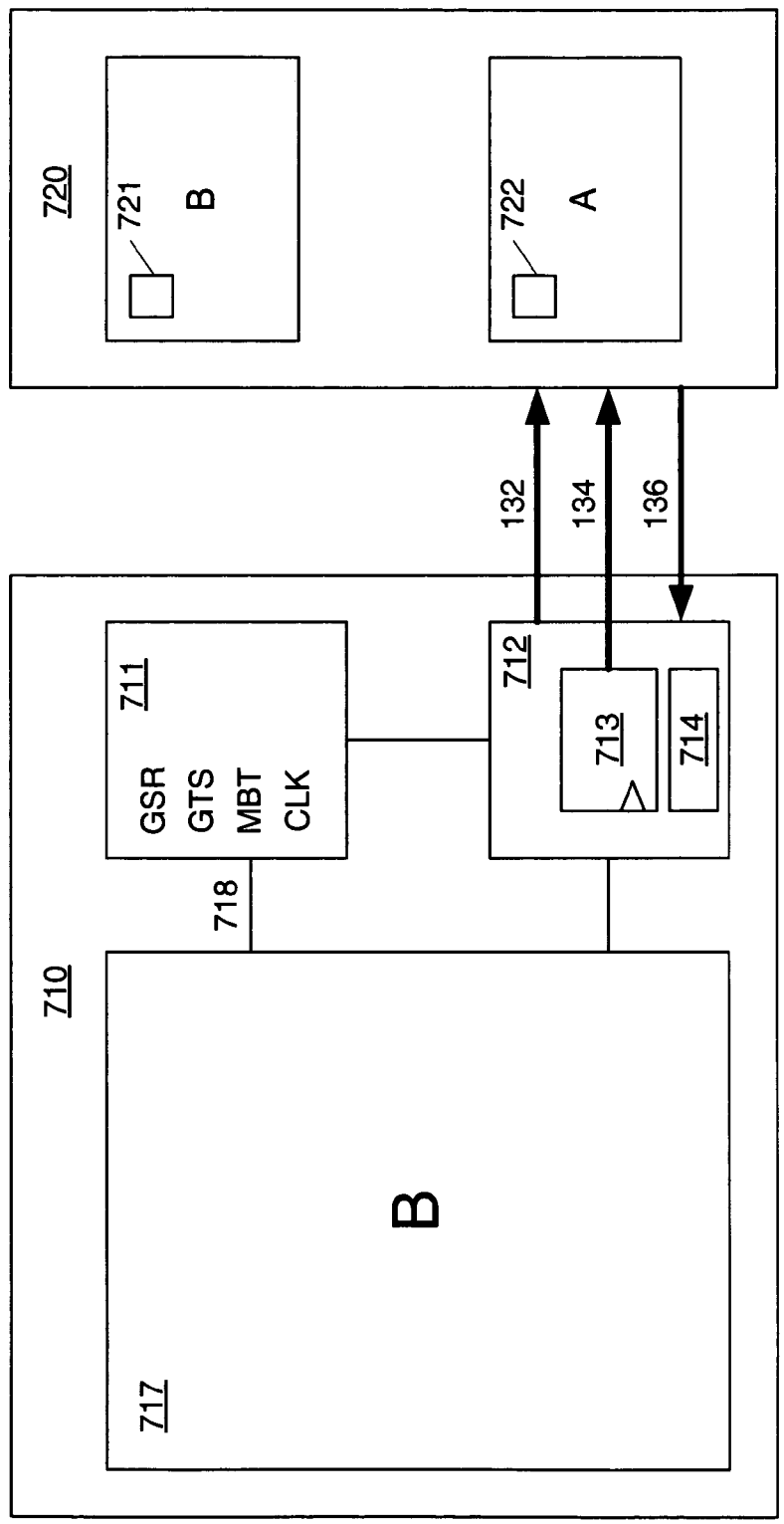
FIG. 8 shows a system with a programmable device having multi-boot configuration capabilities in a second configuration in accordance with an embodiment of the present invention.

FIG. 8 shows a system 800 with programmable device 710 having multi-boot configuration capabilities in a second configuration in accordance with an embodiment of the present invention. As shown, programmable resources 717 of programmable device 710 may be configured with configuration data B stored in memory device 720. In accordance with embodiments of the present invention, programmable device 710 may be adapted to for multi-boot configuration. That is, programmable device 710 may be initially configured with a first bitstream (e.g., bitstream A) corresponding to a first design, as illustrated in FIG. 7. Thereafter, programmable device 710 may be triggered to reconfigure with a second bitstream (e.g., bitstream B) corresponding to a second design, as illustrated in FIG. 8. In some embodiments, as described in greater detail below, programmable device 710 may be further triggered to reconfigure using any of a number of configurations, including two or more configurations, stored in memory device 720.

Multi-boot configuration may be desirable in a wide variety of applications. For example, a programmable device may first boot up in a diagnostic or test configuration based on a particular bitstream. The diagnostic configuration may configure the programmable device to perform certain self test operations. The diagnostic configuration may also be used to test other components connected to the programmable device. For instance, the programmable device in the diagnostic configuration may perform board level checks and tests to verify that all devices on the board have properly powered on and are ready for operations. At that point, a reconfiguration may be triggered to configure the programmable device with another bitstream corresponding to a normal operating configuration. Thus, a programmable device may be used in a system to provide diagnostic features, and once diagnostic tests have been passed, the device may begin normal operations.

As another example, a user may wish the programmable device to configure initially with a "golden" or "failsafe" bitstream corresponding to a known working design. That is, the golden bitstream may configure the device with a design that has been tested and is stable. For instance, the known working design may provide all basic functionality but may not fully support advanced or custom features, etc. A reconfiguration may then be triggered to reconfigure the programmable device with a second bitstream that may correspond to an experimental or "beta" design or a more advanced or customized design. For instance, reconfiguring the programmable device with the second bitstream may enable certain advanced features, although the second bitstream may not be as stable or may not be fully tested. A programmable device with multi-boot configuration features may allow a user to initially power up with a known working bitstream, and switch to an alternate bitstream, which may be updated or configured in the field, and may enable advanced features, provide bug fixes or application customization, etc. In some embodiments, if the alternate bitstream causes an error or is unsuitable for other reasons, the user may switch back to the original golden bitstream. In some embodiments, the programmable device itself may be used to access the memory device by using, for example, the memory interface described above, and write an alternate bitstream. A multi-boot configuration may then be triggered to load the newly written configuration data. Other applications may exist where a multi-boot feature would be desirable or necessary.

In some embodiments, the initially loaded bitstream (e.g., bitstream A of FIG. 7) is "armed" by setting a multi-boot flag 722. For instance, the multi-boot flag may be a bit in the bitstream that sets a register within programmable device 710. By arming the initial bitstream in this way, programmable device 710 may enable the multi-boot feature. Requiring that the initial bitstream be armed reduces the possibility of accidentally triggering a reconfiguration operation. Armed bitstream A may also configure a portion of configurable resources 717 to connect to startup block 711 via a line 718. Startup block 711 may include a MBT (multi-boot trigger) pin coupled to line 718 for triggering multi-boot and a reconfiguration operation. When a reconfiguration operation is desired, the MBT pin may be asserted. In some embodiments, a reconfiguration operation may be triggered by asserting the MBT for a certain period of time (e.g., a logic low pulse lasting at least 300 ns). By requiring a long pulse on MBT to trigger the multi-boot and cause the programmable device to reconfigure, additional protection against accidental triggering, such as by glitches or spurious signals, is provided. In some embodiments, multi-boot flag 721 of alternate configuration bitstream B may not be set. In some embodiments, startup block 711 may include additional pins for providing other functions such as a global set/reset pin GSR, a global tri-state pin GTS, and a clock pin CLK.

As described above, lines 132, 134, and 136, may be used to provide an interface between programmable device 710 and a memory device 720. For example, lines 132 may provide control signals, lines 134 may provide memory addresses, and lines 136 may provide a data bus to transfer configuration data from memory device 720 to programmable device 710. Configuration block 712 of programmable device 710 may control the configuration process, including providing addresses to memory device 720. In some embodiments, a sequence of addresses may be provided by a counter 713 of configuration block 712. Programmable device 710 may be set to a programming mode (e.g., via mode pins 104 of FIG. 1) such that configuration starts at an all zeros address in memory device 720. Thus, counter 713 counts up from all zeros until programmable device 710 is configured, and normal operation with configuration A may begin.

When line 718 is asserted with a pulse of sufficient duration, thereby triggering a multi-boot reconfiguration, counter 713 of configuration block 712 may be set to an all ones address for loading the second or alternate address. Counter 713 may also be configured to count down. A status register 714 within configuration block 712 may be set to store the current state. That is, status register 714 may store information indicating that programmable device 720 was in configuration A when the MBT pin was triggered, and/or that configuration B is about to be loaded. This causes programmable device 710 to ignore the state of its mode pins during the reconfiguration (which would have caused the programmable device to load configuration A), and provides information for subsequent multi-boot reconfigurations to load the proper bitstream. Programmable device 710 may then start loading configuration B starting at the all ones memory address and counting down until configuration is complete. Normal operation with configuration B may then commence. In some embodiments, further multi-boot reconfiguration operations may be triggered by subsequent pulses on the MBT pin. For instance, triggering MBT may allow programmable device 710 to switch back and forth between configurations A and B, or to switch among multiple other configurations.

Figure 9:
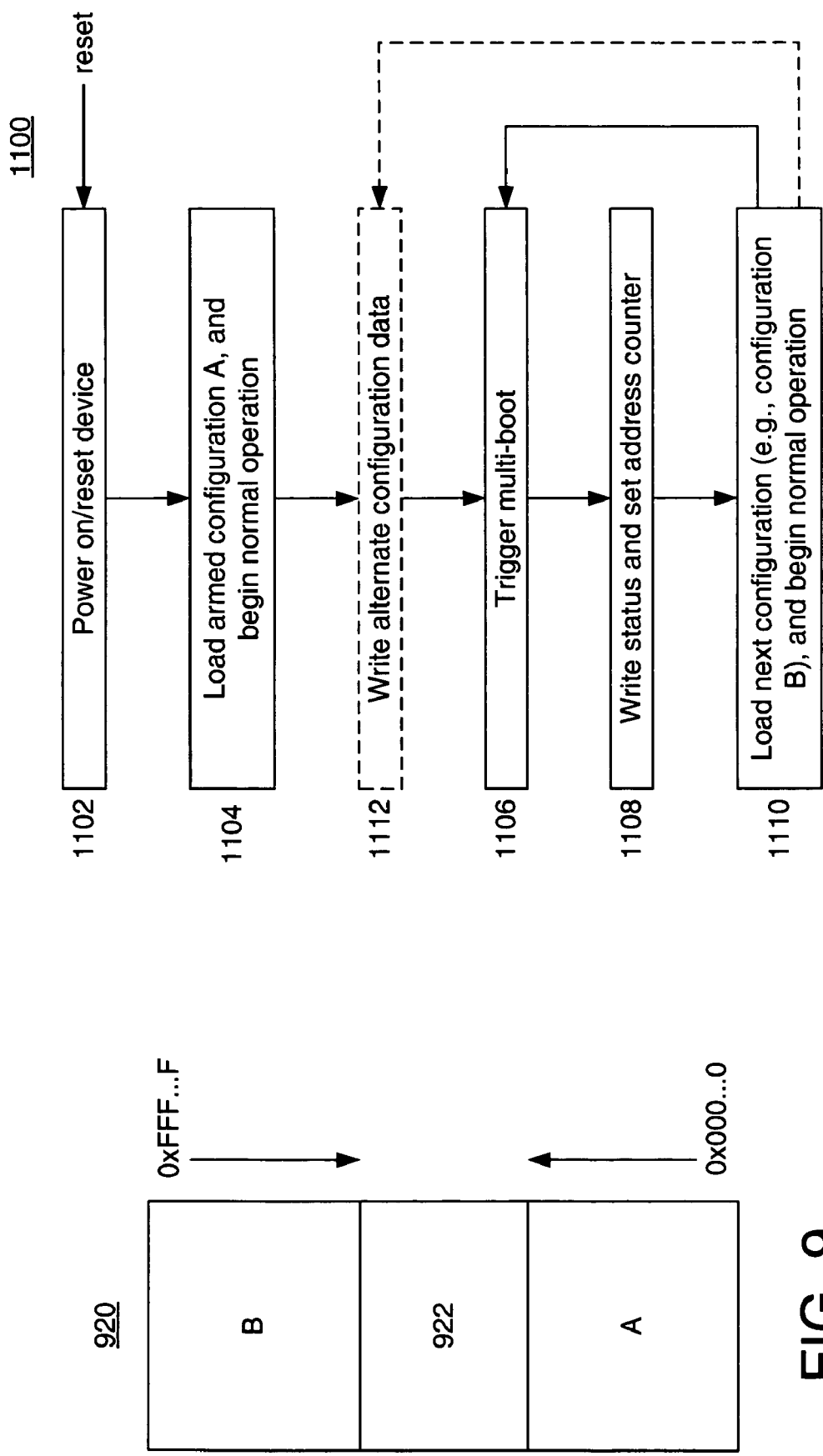
FIG. 9 shows a representation of data stored in an external device for multi-boot configuration in accordance with an embodiment of the present invention.

FIG. 9 shows a representation of data stored in a memory device 920 for multi-boot configuration in accordance with an embodiment of the present invention. Memory device 920, which may be used as device 720 of FIGS. 7 and 8, provides configuration data to a programmable device with multi-boot capability, and may be an internal or external memory. A first configuration A for the programmable device may be stored in a contiguous memory block starting at an all zeros address (e.g., 0x000 . . . 0) and counting up. A second configuration B for a programmable device may be stored starting at an all ones address (e.g., 0xFFF . . . F) and counting down. Depending on the size of memory device 920 and each of configurations A and B, a portion 922 of memory device 920 may remain unused. As described above, this unused portion 922 may be made available for user data during normal operation of the programmable device. Configuration A may be loaded by starting at address 0x000 . . . 0 and counting up. After the multi-boot trigger has been asserted, alternate configuration B may be loaded by starting at address 0xFFF . . . F and counting down. Note that in some embodiments, configuration A may be stored starting at address 0xFFF . . . F and configuration B may be stored starting at address 0x000 . . . 0, and the programmable device may be configured to load the initial configuration from the all ones address.

Figure 10:
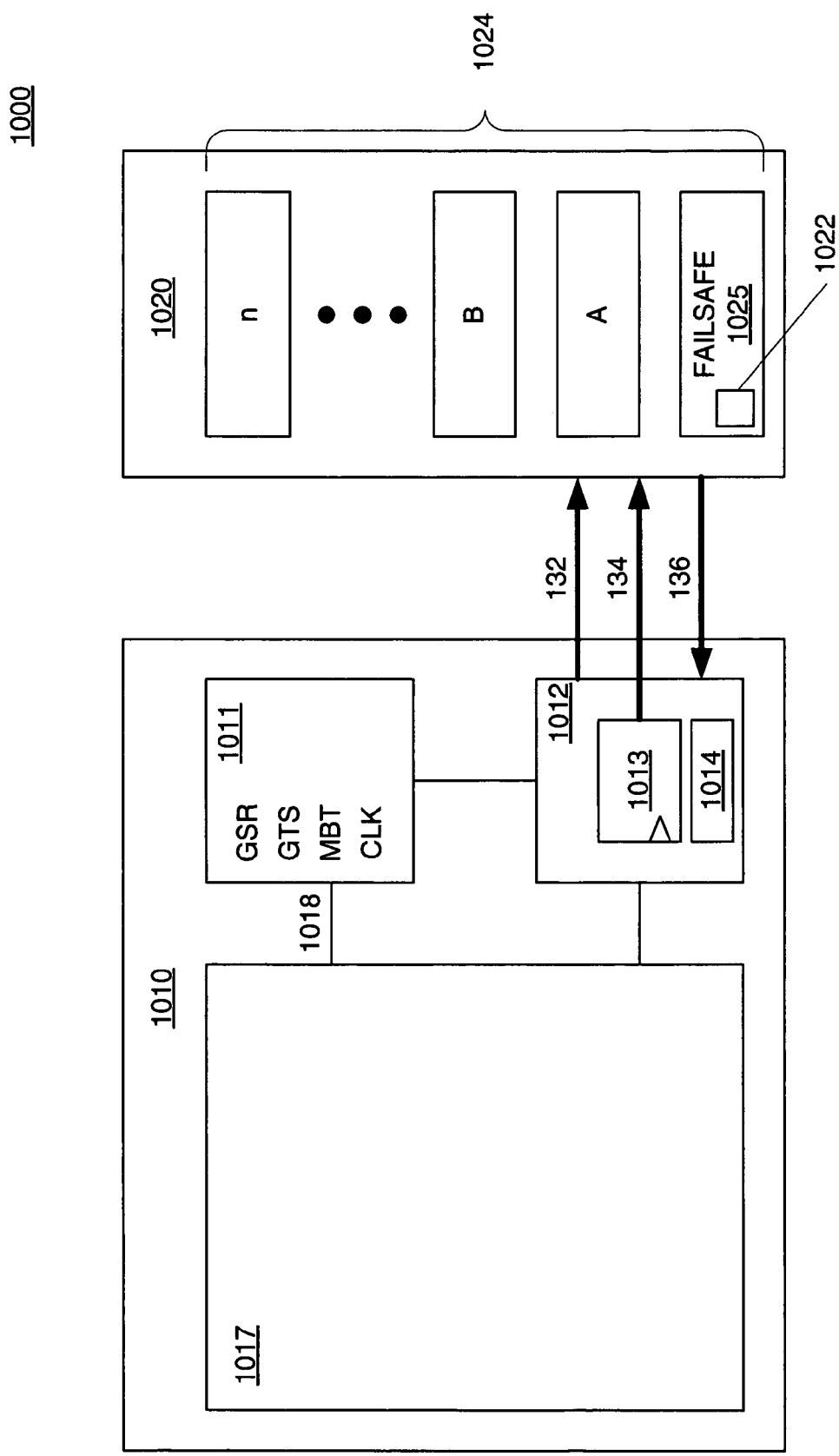
FIG. 10 shows another system with a programmable device having multi-boot configuration capabilities in accordance with an embodiment of the present invention.

FIG. 10 shows another system 1000 with a programmable device 1010 having multi-boot configuration capabilities in accordance with an embodiment of the present invention. Programmable device 1010 may include programmable resources 1017, startup block 1011, and configuration block 1012, which may include counter 1013 and register 1014. Programmable device 1010 may be coupled to an internal or external memory device 1020 via lines 132, 134, and 136. Memory device 1020 may store configuration data for programmable device 1010. In some embodiments, memory device 1020 may store an arbitrary number of multiple bitstreams 1024. In some embodiments, one of bitstreams 1024 may be designated a "failsafe" or default bitstream 1025.

Programmable device 1010 may be initially configured with default bitstream 1025. Default or initial bitstream 1025 may include multi-boot enable flag 1022 that is set, thereby enabling the multi-boot features of programmable device 1010. In some embodiments, each time line 1018 is asserted with a pulse of the required duration, thereby triggering MBT, programmable device 1010 may cycle through bitstreams 1024 (e.g., 1025, A, B . . . n) in turn. Furthermore, each time MBT is triggered, the current status (e.g., indicating the bitstream currently loaded and/or the next bitstream to be loaded) may be stored in register 1014. A "jump" address, which may be the starting address of the next configuration to be loaded, may be loaded into counter 1013 as the starting address in memory device 1020 for the bitstream to be retrieved and loaded. In some embodiments, each bitstream 1024 may be stored at predetermined or fixed memory addresses. For example, bitstreams 1024 may have starting addresses within memory device that are at regular intervals. In such embodiments, each bitstream may be selected in turn by setting certain high order bits of the address. In other embodiments, the memory location of the next configuration bitstream to be loaded may be determined by logic of programmable device 1010, such as a configured circuit in programmable resources 1017, and loaded into counter 1013 prior to triggering multi-boot. The direction the counter should count (i.e., up or down) in order to access the memory block with the desired configuration data may also be specified.

In some embodiments, an error, such as a bitstream that fails to load or an error that occurs during normal operation, may cause programmable device 1010 to automatically self-reconfigure using failsafe bitstream 1025. In other embodiments, a user or a design may force a reconfiguration to failsafe or golden bitstream 1025, based on requirements of the current application. For example, a user may force a hard reset, such as by power cycling the system or by asserting an internal or external reset pin, that causes the programmable device to load the initial or default configuration data.

FIG. 11 shows a flow diagram 1100 for operation of a programmable device configured for multi-boot in accordance with an embodiment of the present invention. First, the programmable device may be powered on or forced to a reset state (step 1102). Programmable device may then load the initial or default configuration data A from a memory, and upon completing configuration, the device may begin normal operation with the design corresponding to configuration A (step 1104). The location of the default configuration may be determined, for example, by mode pins of the programmable device. Configuration A may be an armed bitstream that enables the multi-boot capabilities of the programmable device. Requiring an armed bitstream reduces the possibility for accidentally or inadvertently triggering multi-boot operations. A multi-boot reconfiguration operation may be triggered while armed configuration A is in operation, for example by providing a pulse of sufficient duration to an MBT input of a startup block of the programmable device (step 1106).

Once triggered, currents status of the device may be written to a status register, and a counter (or other addressing mechanism) for providing addresses to the memory may be set with the starting address for the new configuration data to be loaded (step 1108). In embodiments with only two bitstreams available for multi-boot, one bitstream may be stored at an all zeros address and the other bitstream may be stored at an all ones address. In such embodiments, the address counter may be initially reset to zeros and configured to count up to load configuration A, and may be configured to alternate between counting up from all zeros and counting down from all ones, thereby alternating between configurations A and B each time MBT is triggered. In embodiments with more than two configurations, the address counter may be loaded by other means such as user logic, a table or directory structure, a set of predetermined addresses, etc. After storing the current status and setting the address counter, the next configuration (e.g., configuration B) may be loaded and normal operation with the design corresponding the configuration may begin (step 1110).

In some embodiments, an optional step of writing alternate configuration data to the memory device may occur prior to triggering multi-boot (step 1112). As described above, in some embodiments the memory device for storing configuration data may be accessed by user designs. Also, the memory device may be accessed through a JTAG or other interface of the programmable device. This allows a user to overwrite areas of the memory device used for storing configuration data. In particular, a user may provide alternate configuration data while the programmable device is in operation. This may be desirable, for example, to update or upgrade configuration data of a device in the field. The steps of triggering multi-boot, writing current status and setting the address counter, and loading the next configuration (steps 1106, 1108, and 1110), and the optional step of writing alternate configuration data (step 1112) may be repeated to boot additional configurations as desired. A reset operation may also cause the programmable device to reload the default or initial configuration data (e.g., configuration A).

Those having ordinary skill in the relevant arts of the invention will now perceive various modifications and additions that can be made as a result of the disclosure herein. For example, the above text describes the circuits and methods of the invention in the context of integrated circuits such as field programmable gate arrays. However, embodiments in accordance with the invention can also be implemented in other systems including other types of devices that may be partially or fully configurable. Further, circuits and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is to be limited only by the appended claims and their equivalents.

What is claimed is:

1. A system providing an operation to load a plurality of configurations comprising:

a programmable device having programmable resources, a startup block, and configuration memory cells determining the function of the programmable device; and a memory device coupled to the programmable device for storing the plurality of configurations for configuring the programmable resources of the programmable device;

wherein the configuration memory cells of the programmable device are initially configured according to a first configuration of the plurality of configurations, the first configuration comprising a configuration that enables triggering the operation to load a second configuration; and wherein triggering the operation configures the configuration memory cells of the programmable device according to the second configuration of the plurality of configurations.

2. The system of claim 1 wherein the programmable device includes a status register for storing current state of the programmable device.

3. The system of claim 1 wherein triggering a second multi-boot operation of the programmable device configures the programmable device with a third configuration of the plurality of configurations.

4. The system of claim 1 wherein the first configuration is an armed configuration that enables triggering the operation.

5. The system of claim 1 wherein the first configuration is stored starting at an all zeros address of the memory device, and the second configuration is stored starting at an all ones address of the memory device.

6. The system of claim 1 wherein the first configuration is stored starting at an all ones address of the memory device, and the second configuration is stored starting at an all zeros address of the memory device.

7. The system of claim 1 wherein one of the plurality of configurations is a failsafe configuration.

8. The system of claim 1 wherein the first configuration is a diagnostic configuration for testing the system.

9. The system of claim 1 wherein the second configuration is an updated version of the first configuration.

10. The system of claim 7 wherein an error condition of the programmable device triggers multi-boot operation of the programmable device to configure the programmable device with the failsafe configuration.

11. An integrated circuit comprising:
programmable resources comprising configuration memory cells;
a startup block coupled to the programmable resources via a multi-boot trigger input of the startup block; and
a configuration block for loading data into the configuration memory cells according to a first configuration of the programmable resources;
wherein triggering the multi-boot trigger input of the startup block selectively enables the configuration block to load data into the configuration memory cells according to a second configuration of the programmable resources.

12. The integrated circuit of claim 11 wherein the configuration block comprises a status register for storing current state of the integrated circuit.

13. The integrated circuit of claim 11 wherein the programmable resources trigger the multi-boot trigger input of the startup block by providing a pulse of a predetermined duration.

14. The integrated circuit of claim 12 wherein the configuration block further comprises a counter for providing memory addresses.

15. The integrated circuit of claim 14 wherein the counter is a loadable counter for counting starting from a jump address.

16. A method for configuring a programmable device comprising:
loading first configuration data into a plurality of configuration memory cells of the programmable device;
beginning normal operation of the programmable device in a first configuration corresponding to the first configuration data;
triggering a multi-boot operation;
writing a current status of the programmable device to a status register;
loading second configuration data into the plurality of configuration memory cells of the programmable device; and
beginning normal operation of the programmable device in a second configuration corresponding to the second configuration data.

17. The method of claim 16 wherein the first configuration data is armed for enabling multi-boot capability of the programmable device.

18. The method of claim 16 wherein triggering a multi-boot operation comprises providing a pulse having a predetermined pulse width at an internal multi-boot trigger line.

19. The method of claim 16 further comprising writing alternate configuration to a memory device, the alternate configuration overwriting a portion of the second configuration data.

* * * * *